(12) United States Patent
Hao et al.

(10) Patent No.: US 7,414,842 B2
(45) Date of Patent: Aug. 19, 2008

(54) HEAT DISSIPATION DEVICE

(75) Inventors: Ming-Liang Hao, Shenzhen (CN); Ming Yang, Shenzhen (CN); Chin-Lung Chen, Tu Cheng (TW); Yeu-Lih Lin, Tu Cheng (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/308,706

(22) Filed: Apr. 24, 2006

(65) Prior Publication Data

US 2007/0097654 A1 May 3, 2007

(51) Int. Cl.
*H05K 7/20* (2006.01)
*F28F 7/00* (2006.01)

(52) U.S. Cl. .................. 361/697; 361/695; 361/719; 165/121

(58) Field of Classification Search .................. 361/697
See application file for complete search history.

(56) References Cited

U.S. PATENT DOCUMENTS

| | | | |
|---|---|---|---|
| 4,790,374 A * | 12/1988 | Jacoby | 165/185 |
| 6,373,699 B1 | 4/2002 | Chen | |
| 6,698,499 B1 * | 3/2004 | Wagner et al. | 165/80.3 |
| 6,707,676 B1 * | 3/2004 | Geva et al. | 361/719 |
| 6,717,814 B2 | 4/2004 | Li | |
| 6,912,128 B2 * | 6/2005 | Bird et al. | 361/695 |
| 6,924,982 B2 | 8/2005 | Chen et al. | |
| 6,951,446 B2 | 10/2005 | Hung | |
| 6,989,988 B2 * | 1/2006 | Arbogast et al. | 361/695 |
| 7,120,018 B2 * | 10/2006 | Shen et al. | 361/695 |
| 2002/0172008 A1 * | 11/2002 | Michael | 361/697 |

FOREIGN PATENT DOCUMENTS

| | | |
|---|---|---|
| CN | 2550904 Y | 5/2003 |
| CN | 2556788 Y | 6/2003 |
| TW | 547708 | 8/2003 |

* cited by examiner

*Primary Examiner*—Gregory D Thompson

(57) ABSTRACT

A heat dissipation device includes a heat sink with a plurality of fins, a fan mounted on a side of the heat sink with a space formed between the heat sink and the fan, and at least one airflow guiding board formed by one end of at least one of the fins. The airflow guiding board extends through the space to connect with the fan. The airflow guiding board can guide the airflow generated by the fan to the heat sink, so as to reduce the loss of the airflow from the edge of the heat sink, and enhance the effect of heat dissipation. Alternatively, the airflow guide board can also function to guide the airflow to cool other heat sinks.

4 Claims, 6 Drawing Sheets

HEAT DISSIPATION DEVICE

FIELD OF THE INVENTION

The present invention generally relates to a heat dissipation device, and more particularly to a heat dissipation device for electronic elements; the heat dissipation device has a heat sink with a plurality of fins wherein some of the fins are extended to reach an electrical fan to guide an airflow generated by the fan.

DESCRIPTION OF RELATED ART

With the development of large scale integration technology and the information industry, personal computers are becoming more and more popular. As we know, the central processing unit (CPU) is the core unit of the computer system, and anything that effects it also affects the integrity and performance of the computer. With the increasing demand for processing power in computers, the CPUs must now operate at higher speeds and thus generate larger amounts of heat. The heat must be quickly and efficiently removed from CPU; otherwise, the temperature of the CPU will increase above optimal operating temperature, thus affecting the performance and reliability of the computer. Indeed, enhanced functionality and complexity of the newer microprocessors requires an increase in heat dissipation.

Conventionally, a heat sink is mounted onto a CPU, and a fan is assembled to the heat sink. The fan generates forced airflow to the heat sink for enhancing heat dissipation thereof. However, when the airflow passes through the heat sink, a part of it escapes from the edge of the heat sink, which results in its heat dissipation efficiency being reduced. In order to promote the heat dissipation effect of heat sink, an additional airflow guiding duct has been used between the fan and the heat sink for guiding the airflow into the heat sink and preventing the airflow from escaping out of the heat sink. However, this approach has not been proved especially effective. Specifically, the additional airflow guiding duct complicates the structure and assembly process of a heat dissipation device and therefore increases the cost. Furthermore, gaps inevitably exist between the additional airflow guiding duct and the heat sink, where parts of the airflow can escape.

SUMMARY OF INVENTION

Accordingly, an object of the present invention is to provide a heat dissipation device with a simple structure, which can decrease the loss of airflow and promote heat dissipation.

The heat dissipation device comprises a heat sink with a plurality of heat fins, a fan mounted on a side of the heat sink with a space formed between the heat sink and the fan, and at least one airflow guiding board, which is formed by extending the end of the fin at the outmost side of the heat sink to the fan. The at least one airflow guiding board can guide the airflow generated by the fan to the heat sink. The present invention can decrease the loss of airflow compared to those commonly in use today. Meanwhile, the airflow guiding board presents a much larger area for heat dissipation, and its structure is so simple that it can be easily and inexpensively implemented.

BRIEF DESCRIPTION OF DRAWINGS

The foregoing aspects will be better understood from the following detailed description of embodiments of the invention with reference to the drawings, in which.

DETAILED DESCRIPTION

Figure 1:
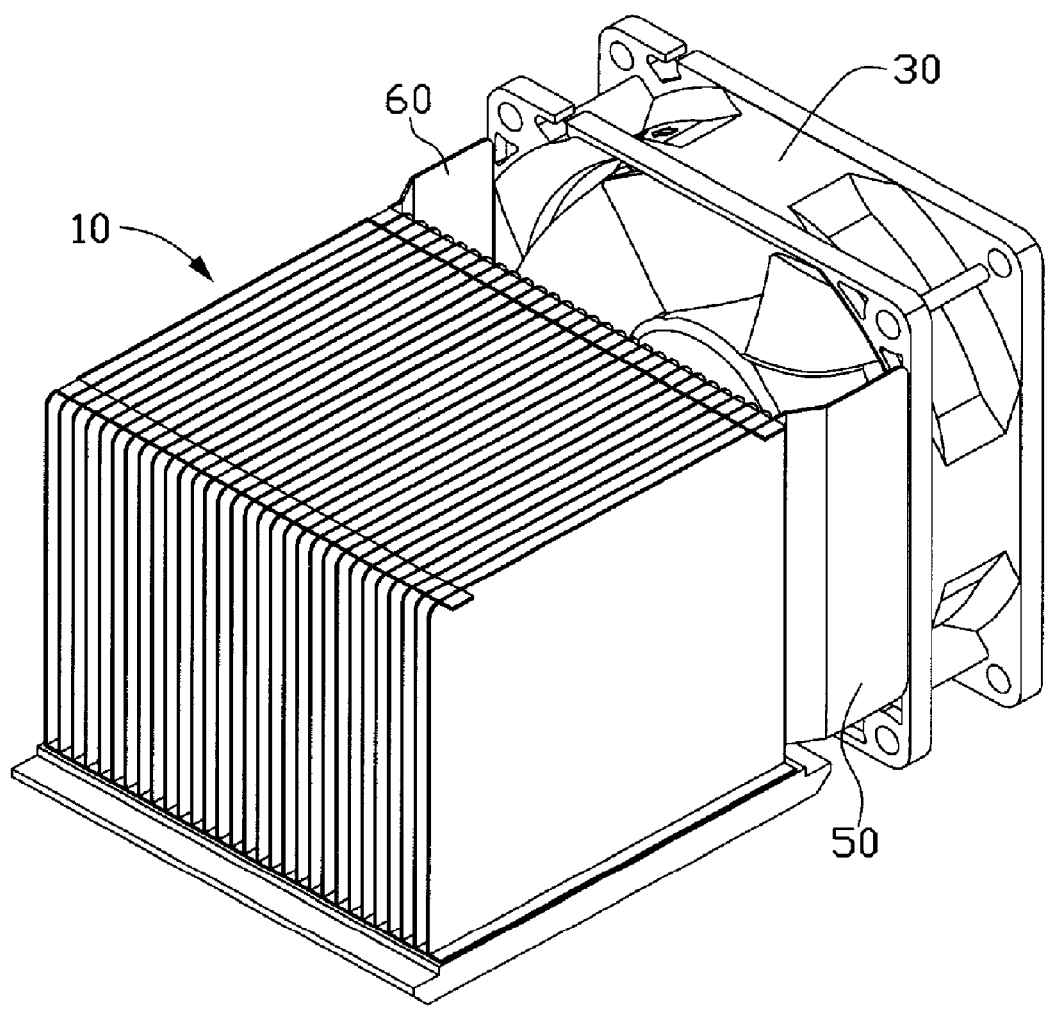
FIG. 1 is an assembled isometric view of a heat dissipation device in accordance with a first embodiment of the present invention.
Figure 2:
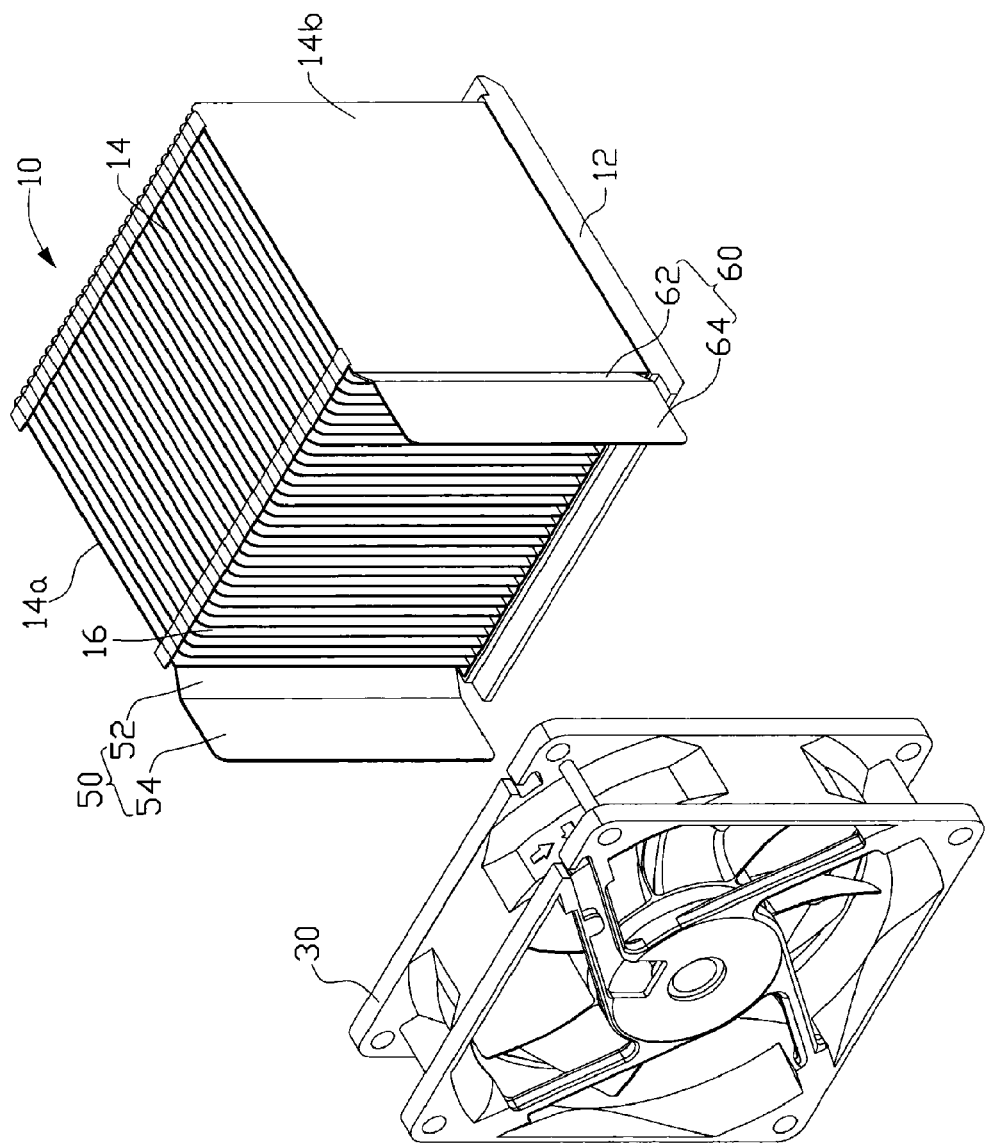
FIG. 2 is an exploded view of FIG. 1, viewed from another aspect.

As shown in FIG. 1 and FIG. 2, a heat dissipation device in accordance with a first embodiment of the present invention includes a heat sink 10, a fan 30 disposed at one side of the heat sink 10 with a space formed between the heat sink 10 and the fan 30, and two airflow guiding boards 50, 60 extending through the space to connect with the fan 30.

The heat sink 10 comprises a base 12 for contacting with a heat source (not shown) such as a central processing unit (CPU) and a plurality of fins 14 arranged on the base 12. The fins 14 vertically extend upwardly from the base 12. The fins 14 are made of heat conductive material. The fins 14 are spaced apart from each other with a same distance. A channel 16 is therefore formed between each two adjacent fins 14. In order to transfer the heat absorbed from the heat source by the heat sink 10 sufficiently, the fan 30 is disposed on a rear side of the heat sink 10. A width of the heat sink 10 is less than that of the fan 30, resulting in the flange of the fan 30 protruding at the outside of the heat sink 10.

Two fins 14a, 14b are defined on two opposite outmost lateral sides of the heat sink 10 and extend through the space to reach the fan 30 to respectively form the airflow guiding boards 50, 60. Preferably, the heat sink 10 is mounted on a motherboard (shown in FIG. 4) of a computer system and the fan 30 is secured on a mainframe of the computer system by screws (not shown). Of course the airflow guiding boards 50, 60 can also be engaged with the fan 30 by means of adhesive, bolts or screws to combine the airflow guiding boards 50, 60 and the fan 30 together.

The airflow guiding boards 50, 60 each comprise an inclined section 52, 62 and a paralleled section 54, 64. The inclined sections 52, 62 extend outward from the two outmost fins 14a, 14b of the heat sink 10 in directions at an angle to the outmost fins 14a, 14b. The paralleled sections 54, 64 extend from distal rear ends of the inclined sections 52, 62 in directions parallel to the fins 14.

In the first embodiment of the present invention, the forced airflow generated by the fan 30 is guided by the airflow guiding boards 50, 60 to flow through the channels 16 of the heat sink 10. The airflow guiding boards 50, 60 located at the two opposite outmost sides of the heat sink 10 are capable of preventing the airflow escaping from the edge of the heat sink 10 and therefore promote the cooling efficiency of the heat sink 10. Furthermore, the airflow guiding boards 50, 60, which are made of heat conductive material increase heat dissipation area of heat sink 10, thereby enhancing heat dissipation efficiency of the heat sink 10.

Figure 3:
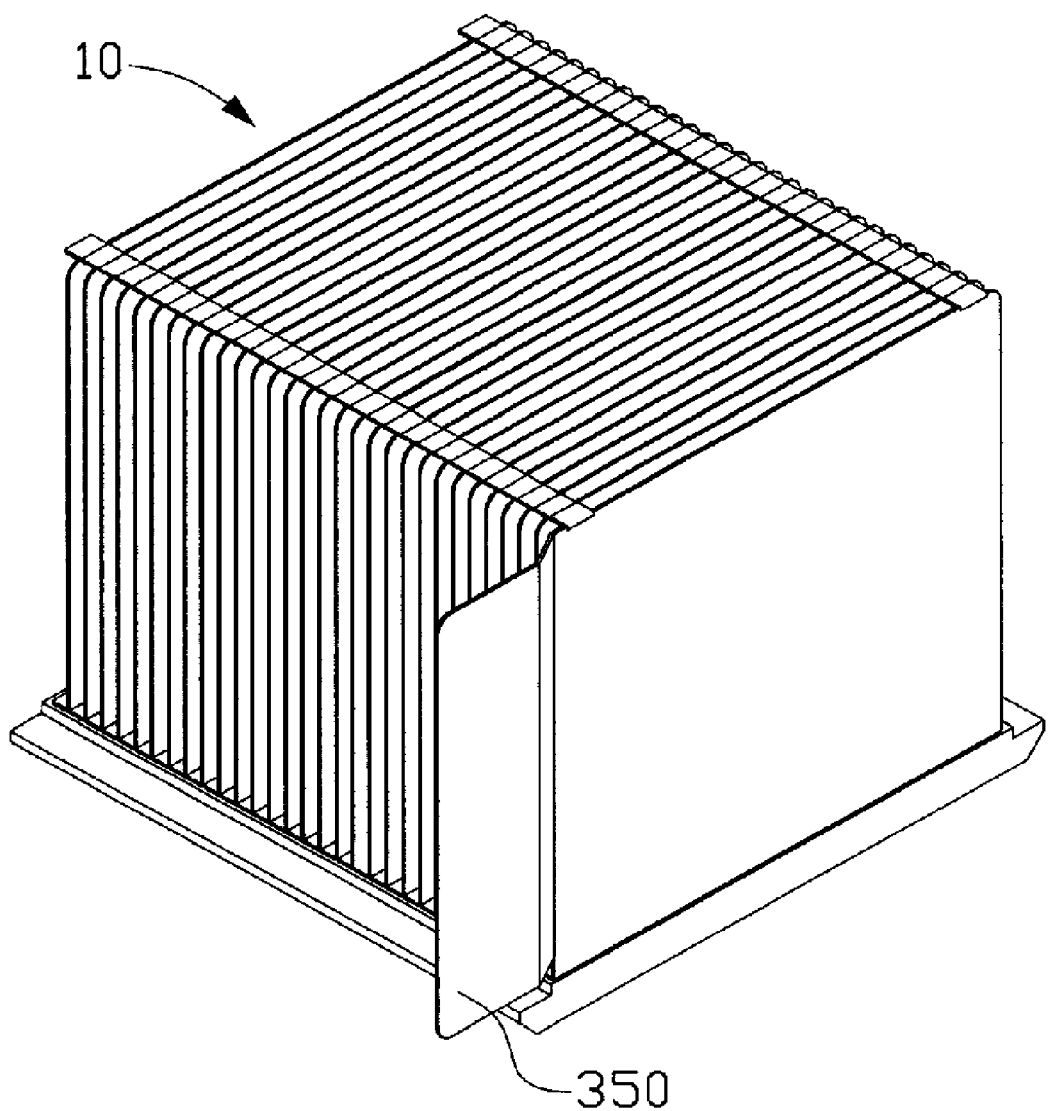
FIG. 3 is an assembled isometric view of a heat dissipation device in accordance with a second embodiment of the present invention.
Figure 4:
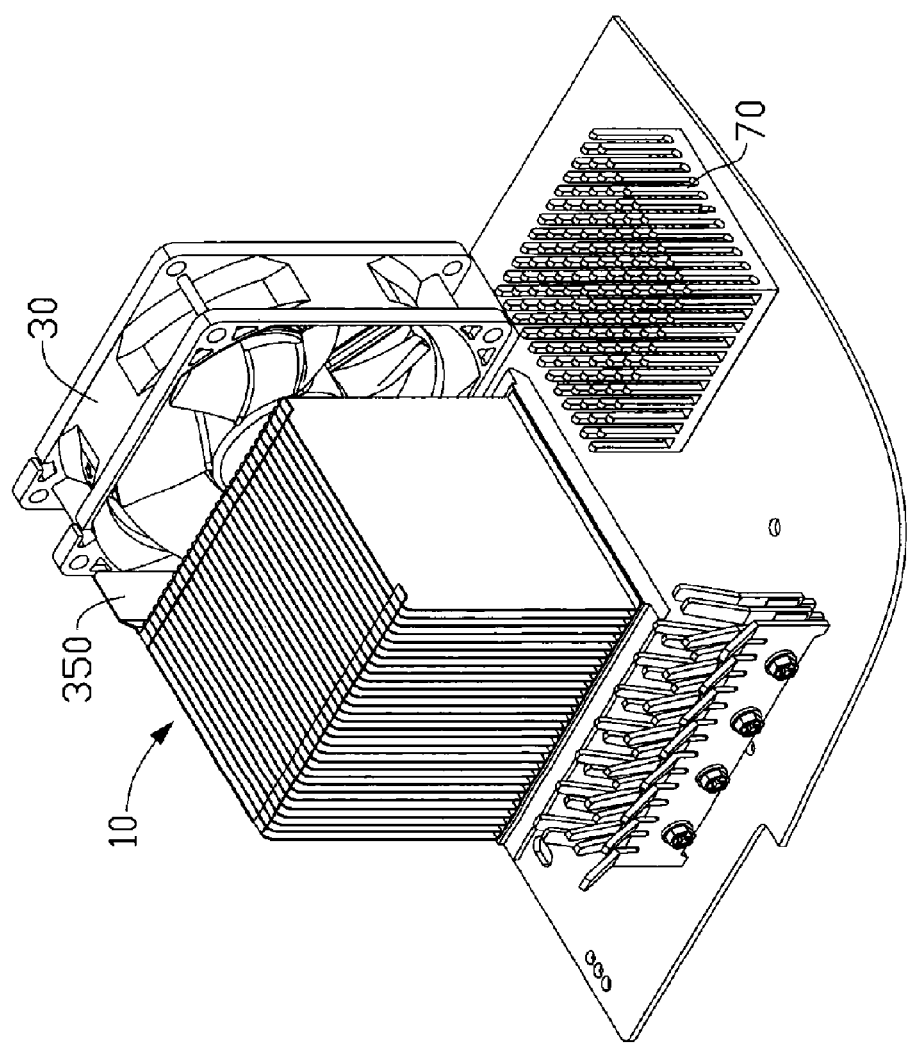
FIG. 4 is an abridged general view of the second embodiment and related components.

A heat dissipation device in accordance with a second embodiment of the present invention is shown in FIG. 3 and FIG. 4. The heat dissipation device comprises a heat sink 10, a fan 30 disposed at one side of the heat sink 10 with a space formed between the heat sink 10 and the fan 30, and an airflow guiding board 350 extending through the space to connect with the fan 30. As shown in FIG. 4, a plurality of electronic components is mounted on the motherboard in a computer system. There is only an airflow guiding board 350 at one outmost side of the heat sink 10 compared to the first embodiment having two airflow guiding boards 50, 60 at opposite two outmost sides of the heat sink 10. The structure of the airflow guiding board 350 is the same as the airflow guiding board 50 in the first embodiment of the invention. The forced airflow generated by the fan 30 partly flows through the heat sink 10 guided by the airflow guiding board 350, while another part flows over other components located near the lateral side of heat sink 10 opposite the airflow guiding board 350. In this design, the airflow generated by the fan 30 can dissipate the heat sink 10 for CPU as well as other more components such as a heat sink 70 for North Bridge chipset.

Figure 5:
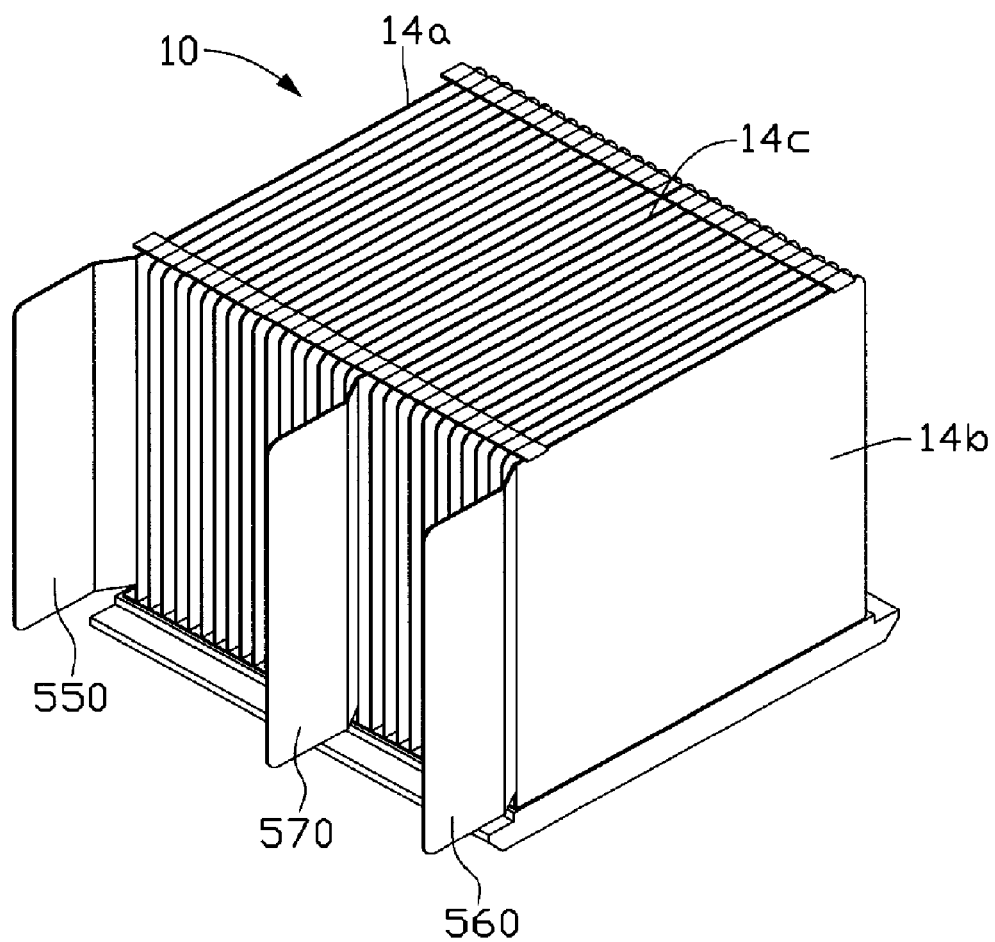
FIG. 5 is an isometric view of a heat sink of a heat dissipation device in accordance with a third embodiment of the present invention.
Figure 6:
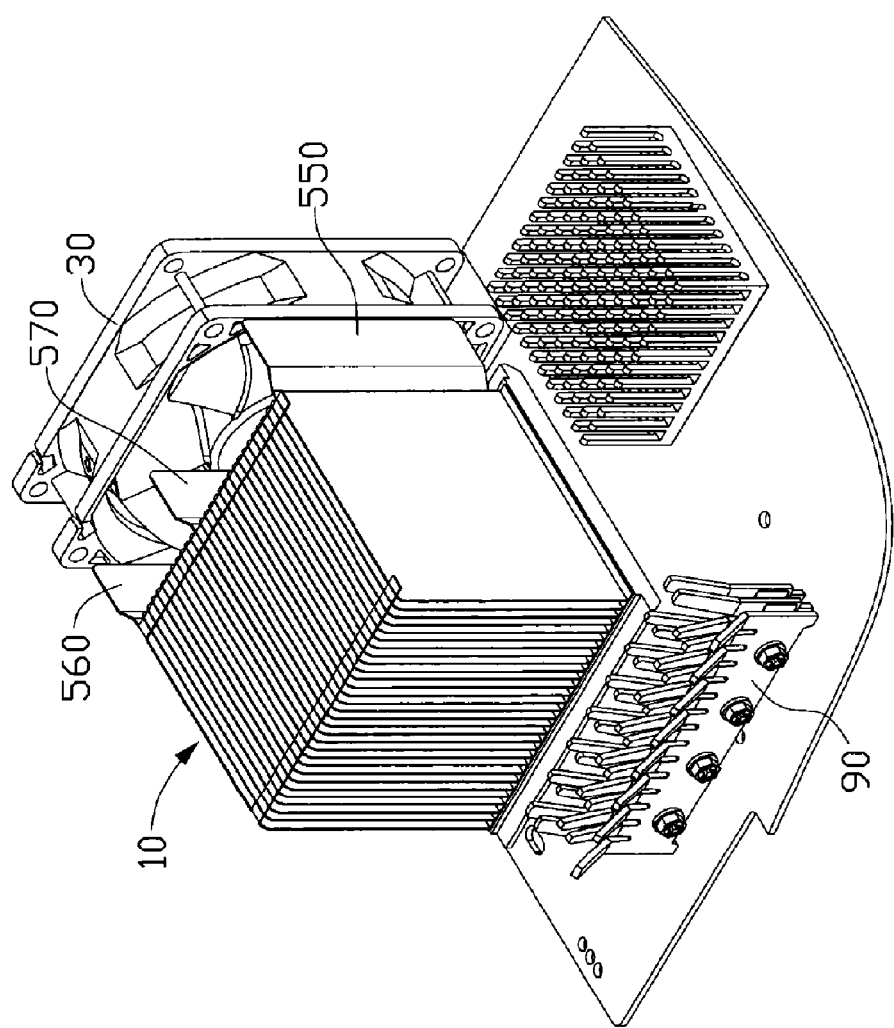
FIG. 6 is an abridged general view of the third embodiment and related components.

A heat dissipation device in accordance with a third embodiment of the present invention is shown in FIG. 5 and FIG. 6. The heat dissipation device comprises a heat sink 10, a fan 30 disposed at one side of the heat sink 10 with a space formed between the heat sink 10 and the fan 30 and airflow guiding boards 550, 560, 570 extending through the space to connect with the fan 30. The airflow guiding boards 550, 560 are formed at opposite two outmost sides of the heat sink 10, while the airflow guiding board 570 is formed by extending a fin 14c inside the heat sink 10 to the fan 30. The fin 14c can be any one of the fins between the two outmost fins 14a, 14b. In this embodiment, the airflow guiding board 570 deviates the middle of the heat sink 10, dividing the space into two parts different in size, of which the relatively large one corresponds to other heat generating components such as a heat sink 90 for a voltage regulator. The heat sink 90 is mounted in front of the heat sink 10. The airflow flowing through the relatively large space can flow on to the heat sink 90. Understandably, the position of the airflow guiding board 570 is adjustable according to the layout of the heat generating components in front of the heat sink 10. The airflow guiding board 570 can be actually defined as two or more if needed.

In above embodiments, the width of the heat sink 10 is less than that of the fan 30. Accordingly, the airflow guiding boards 50, 60, 550, 560 each extend outward from the heat sink 10. Thus, a shrunk airflow duct is formed between the heat sink 10 and the fan 30, which can increase the velocity of the airflow, thereby enhancing heat transferring efficiency of the heat sink 10. Furthermore, the airflow guiding boards can optionally be an inward bended structure when the width of the fan 30 is less than that of the heat sink 10, or a straight structure when the width of the fan 30 and the heat sink 10 are approximate.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device comprising:
   a heat sink, the heat sink having a base, a plurality of fins vertically extending upwardly from the base and forming channels therebetween; and
   a fan disposed at a front side of the heat sink and spaced from the heat sink with a distance;
   wherein an airflow guiding board integrally extends from one of two of the fins located respectively at outmost sides of the heat sink and connects with the fan, an airflow generated by the fan is partly guided by the airflow guiding board to flow through the channels of the heat sink, while another part of the airflow flows to a lateral side of the heat sink to cool another heat sink located at the lateral side of the heat sink and opposite the airflow guiding board.

2. The heat dissipation device of claim 1, wherein the airflow guiding board comprises an inclined section integrally extending from an end of the one of two of the fins and a paralleled section connected with the fan.

3. A heat dissipation assembly comprising:
   a printed circuit board;
   a first heat sink placed over the printed circuit board and comprising:
      a base;
      a plurality of fins extending upwardly from the base and forming channels therebetween;
   a fan mounted in rear of the first heat sink for generating an airflow through the first heat sink and spaced from the first heat sink with a distance;
   a second heat sink placed over the printed circuit board and located at a lateral side of the first heat sink;
   wherein an airflow guiding board integrally extends from one of two of the fins located respectively at outmost sides of the first heat sink and connects with the fan, the airflow generated by the fan is partly guided by the airflow guiding board to flaw through the channels of the first heat sink, while another part of the airflow flows to the second heat sink; and
   wherein the second heat sink is located opposite the airflow guiding board.

4. The heat dissipation assembly of claim 3, wherein the airflow guiding board comprises an inclined section integrally extending from one end of the one of two of the fins and a paralleled section connected with the fan.

* * * * *